United States Patent [19]

Yamada et al.

[11] 4,422,000
[45] Dec. 20, 1983

[54] UNIDIRECTIONAL SURFACE ACOUSTIC WAVE DEVICE WITH MEANDERING ELECTRODE

[75] Inventors: Jun Yamada, Yokohama; Katashi Hazama, Zushi, both of Japan

[73] Assignee: Hitachi, Ltd., Tokyo, Japan

[21] Appl. No.: 374,758

[22] Filed: May 4, 1982

[30] Foreign Application Priority Data

May 8, 1981 [JP] Japan .................................. 56-68340

[51] Int. Cl.$^3$ ........................................... H03H 9/145
[52] U.S. Cl. ............................ 310/313 D; 310/313 B; 333/154
[58] Field of Search ............... 333/193, 195, 154, 194; 310/313 R, 313 B, 313 C, 313 D

[56] References Cited

U.S. PATENT DOCUMENTS

| | | | |
|---|---|---|---|
| 2,894,221 | 7/1959 | Coy | 333/140 |
| 3,686,518 | 8/1972 | Hartmann et al. | 310/313 B |
| 3,866,154 | 2/1975 | Moore | 333/154 |
| 4,267,533 | 5/1981 | Dempsey et al. | 333/151 |

OTHER PUBLICATIONS

Shimizu, Y., et al., "Unidirectional SAW Transducer by Meandering and Interdigital Electrodes", Trans. of IECE, vol. E61, No. 7, pp. 557, 558.

Primary Examiner—J. D. Miller
Assistant Examiner—D. L. Rebsch
Attorney, Agent, or Firm—Antonelli, Terry & Wands

[57] ABSTRACT

A surface acoustic wave device on a piezoelectric substrate comprises an interdigital transducer having an interdigital sending part in the forward direction and an interdigital reflecting part in the reverse direction. An electrical phase difference of $\phi$ (radian) is applied between the sending and reflecting parts, while the distance between the sending and reflecting parts providing a geometrical phase difference therebetween is established to be $$\left\{ n + \left( \frac{1}{2} - \frac{\phi}{2\pi} \right) \right\} \lambda_o$$

where n is a positive integer and $\lambda_o$ is the wavelength of surface acoustic wave. A third, common electrode meanders between the sending and reflecting electrodes.

6 Claims, 3 Drawing Figures

UNIDIRECTIONAL SURFACE ACOUSTIC WAVE DEVICE WITH MEANDERING ELECTRODE

This invention relates to a surface acoustic wave device having a group-type unidirectional transducer which includes interdigital electrodes.

Usually, a surface acoustic wave device includes on the surface of a piezoelectric substrate an input transducer for converting an electric signal into a surface acoustic wave and an output transducer for converting the surface acoustic wave into electric signals. Especially, if the propagation of surface acoustic waves would have good directivity, the wave in the reverse should propagate in one direction and be quenched in the other direction. For this purpose, the input transducer is divided into two parts which are separated at a specified distance from each other and are called sender and reflector electrodes. A phase shifter is connected for applying a phase difference between the sender and reflector electrodes. Such a configuration is shown in FIG. 1.

Referring to FIG. 1, a reference numeral 1 denotes an interdigital sending electrode part, 2 an interdigital reflecting electrode part, 3 a phase shifter, and 6 a specified distance between the sending and reflecting electrode parts 1 and 2. The distance 6 is a center-to-center distance between the sending and reflecting electrode parts.

In the described prior art unidirectional transducer, the center-to-center distance 6 between the sending and reflecting electrode parts 1 and 2 is selected to be an odd multiple of $\lambda_o/4$, where $\lambda_o$ is the wavelength of a surface acoustic wave, and a phase difference applied by the phase shifter 3 is set to be $\pi/2$ (radian). A third electrode 9 meanders between the sending and reflecting electrode and functions as a reference. This is based on the technical concept that in order to realize unidirectivity of propagation of a surface acoustic wave (from the input transducer to the output transducer), the phase difference between the sending and reflecting electrode parts 1 and 2 should be set to be $\pi/2$ (radian) in the sense of electric circuit and to be also $\pi/2$ (radian) in the sense of geometrical electrode arrangement (that is, the electrical and geometrical phase differences are equally distributed), and hence the difference 0 radian between the electrical and geometrical phase is provided in the forward direction (from the input transducer to the output transducer) while the sum $\pi$ radian of the electrical and geometrical phase differences is provided in the reverse direction (from the output transducer to the input transducer). The phase difference $\pi/2$ (radian) applied by the phase shifter 3 corresponds to the electrical phase difference. These are detailed in W. R. Smith et al, "Design of Surface Wave Delay Lines with Interdigital Transducers", IEEE Trans. on Microwave Theory and Techniques Vol. MTT-17, No. 4 Nov. 1969, pp. 865–873 (particularly, see FIG. 7 on p. 869); and K. Yamanouchi et al, "Low Insertion Loss Acoustic Surface Wave Filter Using Group-Type Unidirectional Interdigital Transducer", 1975 ULTRASONICS SYMPOSIUM Proc. pp 317–321 (particularly, see FIG. 1 and FIG. 2 on p. 319)

However, in realizing the above-described construction, the following restriction exists. In order that the phase difference of the phase shifter 3 be equal to $\pi/2$, the constants of the phase shifter 3, i.e. the inductance L and the resistance r should satisfy the following relations:

$$\omega_o L = \left(\frac{1+a}{1+a^2}\right) \cdot \frac{1}{G} = \frac{G + \omega_o C}{G^2 + \omega_o^2 C^2},$$

$$r = \frac{1}{G}\left(\frac{a-1}{1+a^2}\right) = \frac{\omega_o C - G}{G^2 + \omega_o^2 C^2}, \text{ and } a = \frac{\omega_o C}{G},$$

where G and C are the radiation conductance and electric capacitance of the interdigital sending electrode part, respectively. In order to satisfy the unidirectivity of propagation, a condition at $\omega_o C$ (susceptance)$\geq G$ should be fulfilled because of $r \leq 0$ and hence $\omega_o C - G \geq 0$. If $\omega_o C < G$, the unidirectivity cannot be realized. The conductance G depends upon the electrical-mechanical coupling coefficient of the piezoelectric substrate material and/or the number of electrode pairs in an interdigital electrode array. Therefore, the above condition imposes a restriction that when the electrical-mechanical coupling coefficient of used piezoelectric substrate material is large and/or when the transducer is used as a narrow band pass filter requiring a large number of electrode pairs, the conductance G becomes large, thereby resulting in poor unidirectivity. Accordingly, a technique which is free of such a condition or restriction has been desired.

An object of this invention is to provide an improved surface acoustic wave device having a unidirectional interdigital transducer, in which the above-described restriction is eliminated.

The technical concept in and preferred embodiment of this invention will now be described in conjuction with the accompanying drawing, in which.

Figure 1:
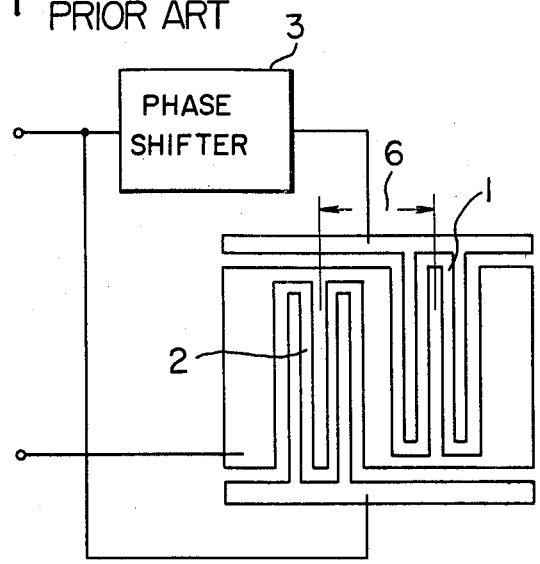
FIG. 1 is a plan view showing the unidirectional interdigital transducer of the prior art surface acoustic wave device.

This invention is based on the fact that good unidirectivity can be obtained if a geometrical phase difference provided between the interdigital sending and reflecting electrode parts is $(\pi - \phi)$ radian, $\phi$ being an electrical phase difference between the sending and reflecting electrode parts applied by a phase shifter. Therefore, the value of inductance L as a circuit constant is first chosen to satisfy the following relation:

$$O \leq L \leq \frac{2C}{A} \quad (1)$$

Then, for one value of L, the value of resistance r is determined from the following relation:

$$r = \frac{-G + \sqrt{G^2 - AB}}{A} \quad (2)$$

Further, for a pair of L and r determined by the relations (1) and (2), the electrical phase difference $\phi$ is obtained from the following relation:

$$\phi = \tan^{-1} \frac{\omega_o(GL + rC)}{1 + rG - \omega_o^2 LC} \quad (3)$$

The center-to-center distance b between the sending and reflecting electrode parts is determined from the following relation:

$$b = \left\{ n + \left( \frac{1}{2} - \frac{\phi}{2\pi} \right) \right\} \lambda_o \quad (4)$$

Here,
$A = G^2 + \omega_o^2 C^2$,
$B = \omega_o^2 L (G^2 L + \omega_o^2 C^2 L - 2C)$,
G: radiation conductance of the sending electrode part,
C: electric capacitance of the sending electrode part,
$\omega_o$: central angular frequency ($=2\pi f_o$),
$\lambda_o$: wavelength of the surface acoustic wave,
n: positive integer.

The circuit constants obtained above may be converted to the electrode dimensions of the interdigital transducer, using well known relations.

Figure 2:
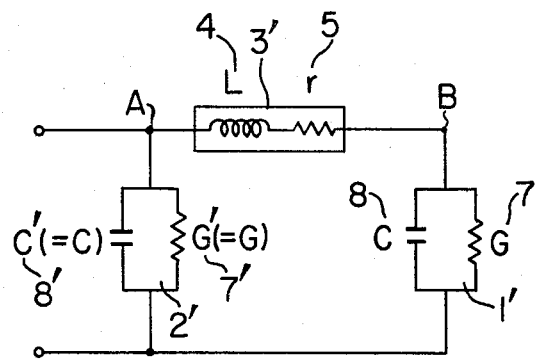
FIG. 2 is an equivalent circuit diagram for explaining the technical concept in this invention.

The above-mentioned technical concept of this invention will be explained briefly with reference to FIG. 2 which shows an equivalent circuit for a sending electrode part 1' and a refelecting electrode part 2'. Referring to FIG. 2, reference numeral 3' denotes a phase shifter having an inductance 4 and a resistance 5; 7 and 7' denote the radiation conductances G and G' of equivalent circuit portions of the sending and reflecting electrode parts 1' and 2', respectively; and 8 and 8' denote the electric capacitances C and C' of equivalent circuit portions of the sensing and reflecting electrode parts 1' and 2', respectively. If a certain tolerable insertion loss in the forward direction is practically acceptable in the unidirectional interdigital tradsducer, it is not required that the electrical phase difference between the sending and reflecting electrode parts 1' and 2' and the geometrical phase difference therebetween, determined by the arrangement of the sending and reflecting electrodes, coincide with each other or has a zero difference therebetween. In other words, it is only required that a difference between the electrical and geometrical phase differences in the reverse direction is $\pi$ (radian). This means that only voltages at points A and B in FIG. 2 need to be equal to each other. The relations between the circuit constants as described before are obtained under such a requirement. Herein, one can see an essential difference of the technical concept in this invention from the technical concept in the prior art device that the electrical and geometrical phase differences should be selected to coincide with each other or should have a zero radian difference therebetween. According to this invention, the equivalent radiation conductances G and G' of and the equivalent electric capacitances C and C' of the sending and reflecting electrode parts 1' and 2', are selected satisfy the following relations:

$$\left. \begin{array}{c} G' = G \\ C' = C \end{array} \right\} \quad (5)$$

Figure 3:
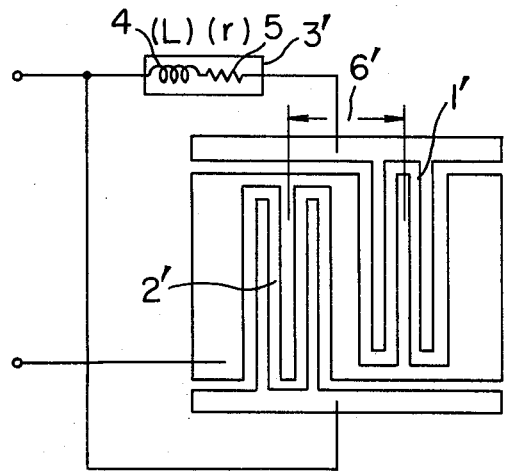
FIG. 3 is a plan view for explaining a unidirectional interdigital transducer of the surface acoustic wave device according to an embodiment of this invention.

FIG. 3 shows a plan view for explaining a unidirectional interdigital input transducer of the surface acoustic wave device according to an embodiment of this invention. This embodiment can be used as a band pass filter which is disposed in an intermediate frequency stage of a color television receiver. 128° rotated Y axis cut lithium niobate is used as a piezoelectric substrate (not shown). The propagation direction of the surface acoustic wave is assumed to be along the X axis. The unidirectional interdigital input electrode is formed on the piezoelectric substrate by the well known photolithographic technique with alluminium-evaporated electrode film of 5000 Å thickness and 17.2 μm width.

The Exemplary constants employed according to this invention are as follows. A phase difference provided by the phase sifter 3' connected between the sending electrode part 1' and the reflecting electrode part 2' was 1.3 radians (74.4 degrees). A third electrode 9' meanders between the sending and reflecting electrode and functions as a reference. A center-to-center distance 6' between the sending and reflecting electrode parts 1' and 2' was 156.4 μm. In this case, the radiation conductance of the sending electrode part 1' was 2 mU (millimho), the electric capacitance thereof was 5.5 pF, the value L of inductance 4 of the phase shifter 3' was 1.2 μH and the value r of resistance 5 threreof was 50Ω. From these constants, it is apparent that the embodiment shown in FIG. 3 fulfills the conditions concerning the phase differences explained in conjunction with the technical concept of this invention.

As apparent from the foregoing description, this invention can provide a unidirectional interdigital transducer without the restriction in the prior art device that the radiation conductance of the sending electrode part (and the reflecting electrode part) should be not greater than the susceptance thereof. Therefore, this invention is sufficiently applicable even when a piezoelectric substrate having a large electrical-mechanical coupling coefficient is used and/or when the transducer is employed as a narrow band pass filter in which the number of electrode pairs in the interdigital transducer is large. Therefore, this invention will greatly contribute to the field of interdigital surface acoustic wave filters.

Though the embodiment has been described in conjunction with the interdigital input transducer, the teaching of this invention is equally applicable to an interdigital output transducer. Thus, this invention covers a surface acoustic wave device in which the teaching of this invention is applied to at least one of interdigital input and output transducers.

We claim:

1. A surface acoustic wave device comprising an interdigital input transducer and an interdigital output transducer formed on a piezoelectric substrate, at least one of said input and output transducers being unidirectional and having an interdigital sending electrode part disposed nearer to the other transducer and an interdigital reflecting electrode part disposed apart from the other transducer, a common electrode disposed between said sending and reflecting electrode parts, an electrical phase difference being provided between said sending and reflecting electrode parts, in which the electrical phase difference between said sending and reflecting electrode parts is established to be $\phi$ in the unit of radians, which is not equal to $\pi/2$ radians and a distance between said sending and reflecting electrode parts providing a geometrical phase difference therebetween is established to be $$\left\{n + \left(\frac{1}{2} - \frac{\phi}{2\pi}\right)\right\} \lambda_o$$

where n is a positive integer and $\lambda_o$ is the wavelength of a surface acoustic wave.

2. A surface acoustic wave device according to claim 1, wherein said electrical phase differnece $\phi$ is applied by a phase shifter connected between said sending and reflecting electrode parts and having an inductance component L and a resistance component r which are respectively defined by $$o \leq L \leq \frac{2C}{A} \text{ and } r = \frac{-G + \sqrt{G^2 - AB}}{A}$$

where
$A = G^2 + \omega_o^2 C^2$
$B = \omega_o^2 L(G^2 L + \omega_o^2 C^2 L - 2C)$
$\omega_o = 2\pi f_o$
$f_o$: center frequency of the surface acoustic device
G: radiation conductance of the sending electrode part
C: electric capacitance of the sending electrode part.

3. A surface acoustic wave device comprising an interdigital input transducer and an interdigital output transducer formed on a piezoelectric substrate, at least one of said input and output transducers being unidirectional and having an interdigital sending electrode part disposed nearer to the other transducer and an interdigital reflecting electrode part disposed farther from the other transducer than the sensing electrode part, and a common electrode disposed between said sending and reflecting parts, an electrical phase difference being provided between said sending and reflecting electrode parts, in which the electrical phase difference between said sending and reflecting electrode parts is established to be $\phi$ in the unit of radians which is not equal to $\pi/2$ radians, and a distance between said sending and reflecting electrode parts providing a geometrical phase difference therebetween which is established to be $$\left\{n + \left(\frac{1}{2} - \frac{\phi}{2\pi}\right)\right\} \lambda_o$$

where n is a positive integer and $\lambda_o$ is the wavelength of a surface acoustic wave.

4. A surface acoustic wave device according to claim 3, wherein said electrical phase difference $\phi$ is applied by a phase shifter connected between said sending and reflecting electrode parts and having an inductance component L and a resistance component r which are respectively defined by $$o \leq L \leq \frac{2C}{A} \text{ and } r = \frac{-G + \sqrt{G^2 - AB}}{A}$$

where
$A = G^2 + \omega_o^2 C^2$
$B = \omega_o^2 L(G^2 L + \omega_o^2 C^2 L - 2C)$
$\omega_o = 2\pi f_o$
$f_o$: center frequency of the surface acoustic device
G: radiation conductance of the sending electrode part
C: electric capacitance of the sending electrode part.

5. A surface acoustic wave device comprising an interdigital input transducer and an interdigital output transducer formed on a piezoelectric substrate, at least one of said input and output transducers being unidirectionally conductive in a forward direction and being essentially nonconductive in a reverse direction, and having an interdigital sending electrode part disposed nearer to the other transducer and an interdigital reflecting electrode part disposed farther from the other transducer than the sending electrode part, and a common electrode disposed between said sending and reflecting parts, an electrical phase difference being provided between said sending and reflecting electrode parts, in which the electrical phase difference between said sending and reflecting electrode parts is established to be $\phi$ in the unit of radians which is not equal to $\pi/2$ radians, a distance between said sending and reflecting electrode parts providing a geometrical phase difference therebetween which is established to be $$\left\{n + \left(\frac{1}{2} - \frac{\phi}{2\pi}\right)\right\} \lambda_o$$

where n is a positive integer and $\lambda_o$ is the wavelength of a surface acoustic wave, and the difference between the electrical and geometrical phases in the reverse direction being $\pi$ radians.

6. A surface acoustic wave device according to claim 1, wherein said electrical phase difference $\phi$ is applied by a phase shifter connected between said sending and reflecting electrode parts and having an inductance component L and a resistance component r which are respectively defined by $$o \leq L \leq \frac{2C}{A} \text{ and } r = \frac{-G + \sqrt{G^2 - AB}}{A}$$

where
$A = G^2 + \omega_o^2 C^2$
$B = \omega_o^2 L(G^2 L + \omega_o^2 C^2 L - 2C)$
$\omega_o = 2\pi f_o$
$f_o$: center frequency of the surface acoustic device
G: radiation conductance of the sending electrode part
C: electric capacitance of the sending electrode part.

* * * * *